United States Patent
Lee et al.

(10) Patent No.: US 8,614,912 B2
(45) Date of Patent: *Dec. 24, 2013

(54) MAGNETIC RANDOM ACCESS MEMORY (MRAM) LAYOUT WITH UNIFORM PATTERN

(71) Applicant: QUALCOMM Incorporated, San Diego, CA (US)

(72) Inventors: Kangho Lee, San Diego, CA (US); Taehyun Kim, San Diego, CA (US); Xia Li, San Diego, CA (US); Jung Pill Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/869,086

(22) Filed: Apr. 24, 2013

(65) Prior Publication Data

US 2013/0235639 A1 Sep. 12, 2013

Related U.S. Application Data

(63) Continuation of application No. 12/901,074, filed on Oct. 8, 2010, now Pat. No. 8,441,850.

(51) Int. Cl.
*G11C 11/14* (2006.01)

(52) U.S. Cl.
USPC ............... 365/171; 365/63; 365/210.1

(58) Field of Classification Search
USPC ............... 365/148, 158, 171, 210.1, 63
See application file for complete search history.

(56) References Cited

U.S. PATENT DOCUMENTS

| | | | |
|---|---|---|---|
| 6,385,361 B1 | 5/2002 | Corr | |
| 6,928,015 B2 | 8/2005 | Ooishi | |
| 7,313,014 B2 | 12/2007 | Ooishi | |
| 7,508,700 B2 | 3/2009 | Zhong et al. | |
| 7,646,623 B2 | 1/2010 | Koide | |
| 8,441,850 B2 * | 5/2013 | Lee et al. | 365/171 |
| 2004/0160848 A1 | 8/2004 | Rinerson et al. | |
| 2005/0237791 A1 | 10/2005 | Motoyoshi | |
| 2010/0091550 A1 | 4/2010 | Chen et al. | |
| 2010/0118581 A1 | 5/2010 | Okayama | |
| 2010/0123207 A1 | 5/2010 | Zhong et al. | |
| 2012/0087184 A1 | 4/2012 | Lee et al. | |

OTHER PUBLICATIONS

International Preliminary Report on Patentability—PCT/US2011/055634—The International Bureau of WIPO Geneva, Switzerland, Jan. 16, 2013.
International Search Report and Written Opinion—PCT/US2011/055634—ISA/EPO—Jan. 25, 2012.

* cited by examiner

*Primary Examiner* — Gene Auduong
(74) *Attorney, Agent, or Firm* — Sam Talpalatsky; Nicholas J. Pauley; Joseph Agusta

(57) ABSTRACT

A large scale memory array includes a uniform pattern of uniformly sized dummy bit cells and active bit cells. Sub-arrays within the large scale memory array are separated by the dummy bit cells. Signal distribution circuitry is formed with a width or height corresponding to the width or height of the dummy bit cells so that the signal distribution circuitry occupies the same footprint as the dummy bit cells without disrupting the uniform pattern across the large scale array. Edge dummy cells of a similar size or larger than the standard size bit cells may be placed around the edge of the large scale array to further reduce pattern loading affects.

23 Claims, 6 Drawing Sheets

MAGNETIC RANDOM ACCESS MEMORY (MRAM) LAYOUT WITH UNIFORM PATTERN

CROSS REFERENCE TO RELATED APPLICATIONS

The present application is a continuation of U.S. patent application Ser. No. 12/901,074 to LEE et al., filed Oct. 8, 2010.

TECHNICAL FIELD

The present disclosure generally relates to magnetic random access memory (MRAM). More specifically, the present disclosure relates to methods and apparatuses for fabricating MRAM devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two layers has at least one pinned magnetic polarization (or fixed layer) set to a particular polarity. The magnetic polarity of the other magnetic layer (or free layer) is altered to represent either a "1" (e.g., anti-parallel to the fixed layer) or "0" (e.g., parallel to the fixed layer). One such device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

FIG. 1 is a circuit schematic illustrating a portion of a conventional magnetic random access memory (MRAM). An MRAM 100 is divided into a number of bitcells 110, 140, 160. During read out of the bitcell 160, the resistance of the bitcell 160 is compared to the reference parallel bitcell 110 and the reference anti-parallel bitcell 140. Resistance of the bitcells 110, 140, 160 are measured by applying a source voltage and determining an amount of current flowing through the bitcells 110, 140, 160. For example, in the bitcell 110, a voltage source 120 is applied to a magnetic tunnel junction (MTJ) 112 by read select transistors 122, 124, and a word line select transistor 126. The MTJ 112 includes a fixed layer 114, tunneling layer 116, and a free layer 118. When the free layer 118 and the fixed layer 114 have magnetizations aligned substantially parallel, the resistance of the MTJ 112, and thus the bitcell 110, is low. When the free layer 118 and the fixed layer 114 have magnetizations aligned substantially anti-parallel, the resistance of the MTJ 112, and thus the bitcell 110, is high.

Bitcells of a magnetic random access memory may be arranged in one or more arrays including a pattern of memory elements (e.g. MTJ in case of MRAM). In order to achieve high-yielding memory arrays, it is critical to tightly control the size of memory elements. Previous design techniques for implementing large-scale memory arrays have been hampered by the macro-loading effect that are inherent in the etching process. For example, the etching rate of memory elements may be larger at the edge of arrays in comparison to the center of arrays because the pattern density is smaller at the edge. As a result, the size of an MTJ at the edge of a unit array block can be substantially different from the size of an MTJ near the center of the array block. This may causing reduced production yields.

Patterning a large number of uniformly sized memory cells in an large scale memory array such as an MRAM array may provide a uniform pattern density over a relatively large area and may increase production yields. The macro-loading effect may be reduced by providing large-scale arrays of uniformly sized memory cells so that a larger number of the memory cells reside in areas of uniform pattern density after etching. However, various design constraints and challenges have hampered development of large scale MRAM arrays with uniform pattern density.

Previously proposed methods for providing large-scale MRAM arrays have not provided for placement of signal distribution lines or circuitries within memory arrays. Signal distribution lines such as word line (WL) strapping and are needed in practical designs, for example to provide low-resistance signal paths to bitcells within a number of bitcell sub-arrays. Simple signal-boosting circuitry may be used instead of metal strapping. In addition, substrate ties may be placed periodically inside memory arrays to provide the bulk connection of access transistors in bitcells. Generally the width of WL strapping and substrate ties are minimized with applicable design rules to save area.

One method of providing placement of signal distribution lines in a large-scale memory array is described with reference to FIG. 2. The large-scale memory array 202 is divided into a number of sub-arrays 204 each of which includes a pattern of 64×64 bit cells, for example. To compensate for the macro loading effect at the edge of each sub-array, a number of dummy bit cells may be placed around the perimeter of each sub-array 204. These dummy bit cells can include non-functional memory cells, such as floating MTJs which are not connected to memory control circuitry. However, word line strapping and substrate ties may occupy areas that do not include MTJs.

In FIG. 2, the signal distribution lines or circuitry cause pattern discontinuities which affect overall pattern density of the array. Because the large scale arrays includes a large number of relatively small sub-arrays, this method generates a large number of pattern discontinuities to accommodate placement of signal distribution lines such as substrate ties or WL strapping. Although increasing the number of dummy cells may mitigate this problem, this approach is not economically practical because multiple lines of dummy cells in sub-arrays would dramatically increase the total chip size. Hence, in practical memory arrays, the minimal number of dummy memory cells may be placed, and their size may be relatively larger than that of active memory cells within the sub-arrays 204 to compensate for stronger loading effect at the edges of sub-arrays. However, this approach often results in considerable degradation of pattern uniformity.

Construction of large scale memory arrays with uniform pattern density throughout has been proposed to reduce the macro-loading effect and increase production yields. Such proposals have failed to address various design constraints and have not provided a method for placement of WL strapping or substrate ties, for example.

BRIEF SUMMARY

Aspects of the present disclosure include a large-scale memory array including a uniform pattern of memory elements. Sub-arrays within the large-scale memory array are separated by signal distribution lines or circuitry such as word line (WL) strapping and substrate ties. In illustrative embodiments, a substrate tie may be a metal contact to the memory array substrate. For example in an n-channel metal oxide semiconductor (NMOS), the substrate may be p-type and connected to the ground (Vss). In a p-channel metal oxide semiconductor (PMOS), the substrate (n-well in CMOS process) may be n-type and connected to the power (Vdd). WL strapping may be a metal-via stack that connects to poly gates of the large scale memory, for example.

The unit layout cells for the signal distribution lines or circuitry (signal distribution cells) are formed with a width or height corresponding to the width or height of active bit cells within the sub-arrays. Thus, the signal distribution cells occupy an area having the same footprint as the active bit cells. This allows placing dummy memory elements in signal distribution cells without disrupting pattern uniformity across sub-arrays, which in turn, prevents pattern discontinuities of memory elements across the large scale array. In this case, the dummy bitcells with larger dummy memory elements are not required, which can lead to reduction in the total chip size.

Because MTJ pattern uniformity is maintained across sub-arrays, the dummy bitcells with the large-size dummy memory elements are not required. However, dummy bitcells can also be placed in sub-arrays for other purposes, for example, to provide transistor dummies. In this case, the dummy memory elements inside the dummy bitcells must be the same as that of active memory elements.

Edge dummy cells of a similar size or larger than the standard size memory cells may be placed around the edge of the large scale array to reduce or eliminate the macro-loading effect at the edges An aspect of the present disclosure provides an apparatus including a pattern of adjacent uniformly sized bit cells in a memory array and signal distribution circuitry. The signal distribution circuitry occupies an area having a size coinciding with an integer multiple of a size of the uniformly sized bit cells.

The apparatus includes a number of active bit cells outside of the signal distribution circuitry footprint. A resistive memory element such as a magnetic tunnel junction, for example, is configured in each of the active bit cells.

According to aspects of the present disclosure, the apparatus may include a number of sub-arrays of the active bit cells separated by the dummy bit cells. At least one of the sub-arrays may be surrounded by the signal distribution circuitry. The signal distribution circuitry is coupled to the active bits of the number of sub-arrays. The signal distribution circuitry may include word line strapping extending in a first dimension of the pattern and at least one substrate tie extending in a second dimension of the pattern.

According to another aspect of the present disclosure, a number of edge dummy cells extend around a perimeter of the large scale memory array. The edge dummy cells may include uniformly sized memory elements or memory elements larger than the uniformly sized memory elements.

The large scale memory array including a pattern uniformly spaced memory elements according to the present disclosure may be integrated into a magnetic random access memory (MRAM). In an illustrative embodiment, the memory array may be integrated into a mobile phone, a set top box, a music player, a video player, an entertainment unit, a navigation device, a computer, a hand-held personal communication systems (PCS) unit, a portable data unit, or a fixed location data unit, for example.

Another aspect of the present disclosure includes a method for forming a large scale memory array. The method includes forming a pattern of adjacent uniformly sized bit cells in a memory array and forming signal distribution circuitry. In an illustrative embodiment, the signal distribution circuitry is formed to have a width coinciding with an integral multiple of widths of the uniformly sized bit cells.

In another aspect, an apparatus has means for storing data. The data storing means are uniformly sized and arranged within a memory array. The apparatus also has means for distributing signals. The signal distributing means occupies an area having a size coinciding with an integer multiple of a size of the uniformly sized data storing means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
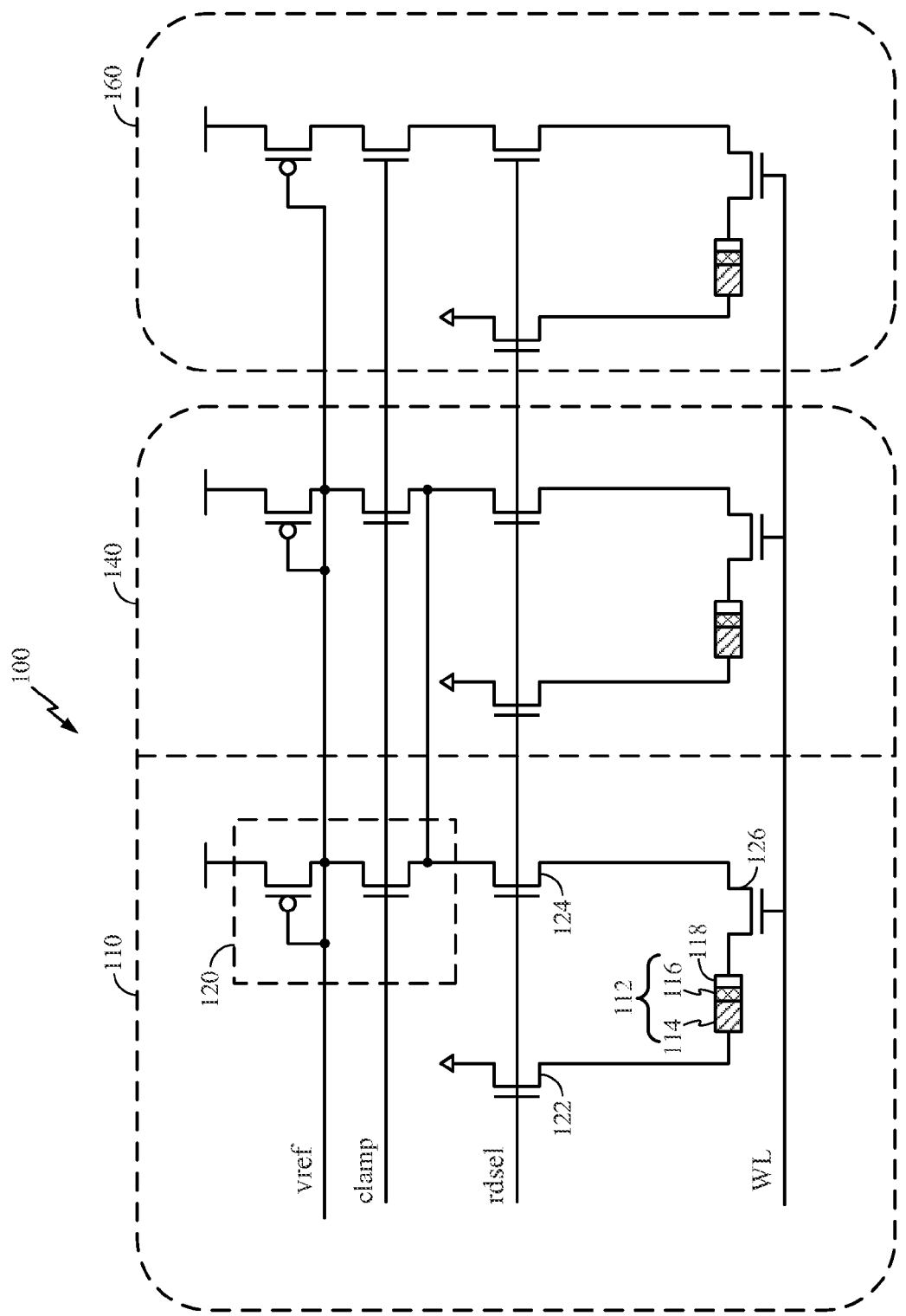
FIG. 1 is a circuit schematic illustrating a portion of a conventional magnetic random access memory (MRAM).
Figure 2:
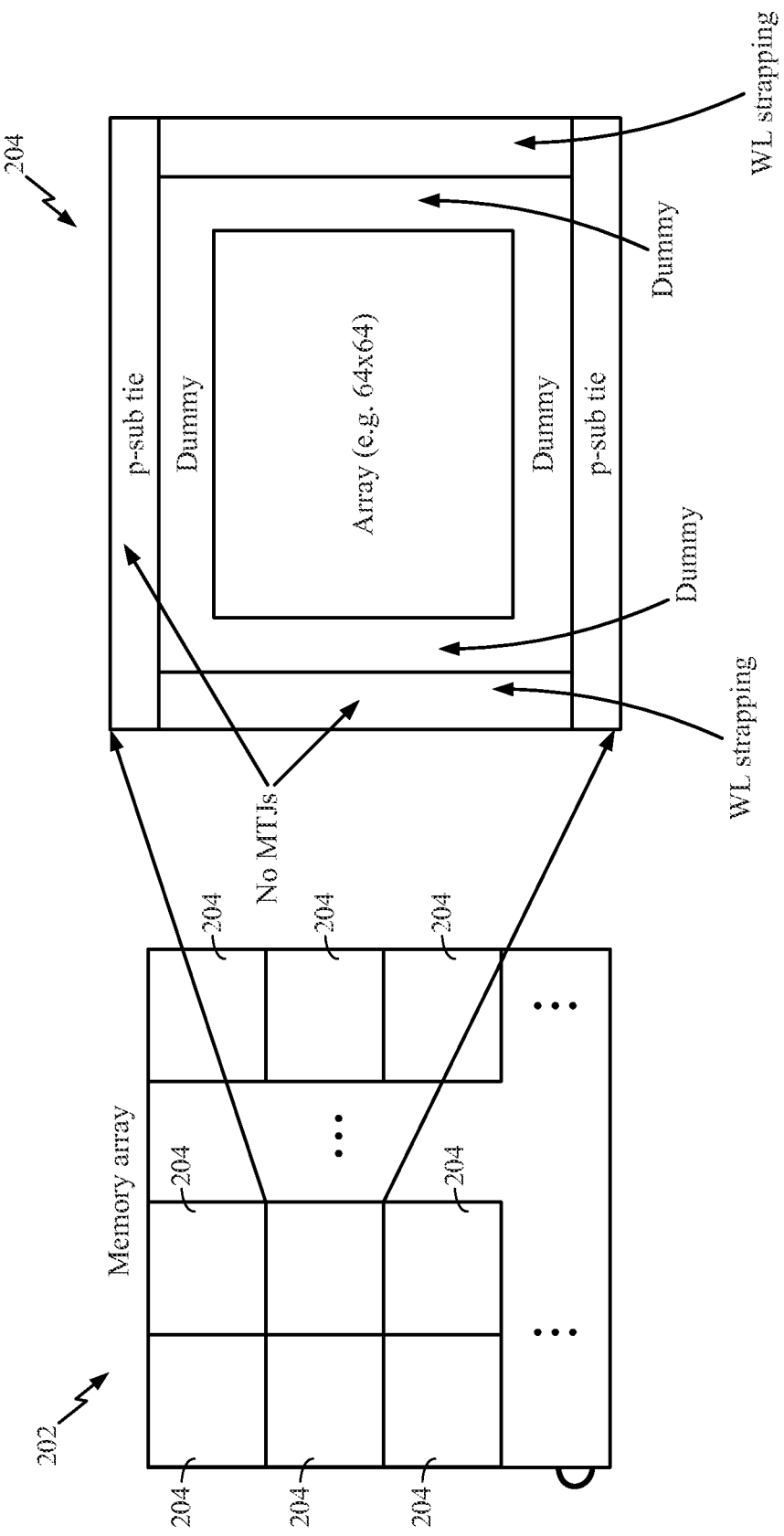
FIG. 2 is block diagram showing a large scale MRAM memory array according to the PRIOR ART.
Figure 3:
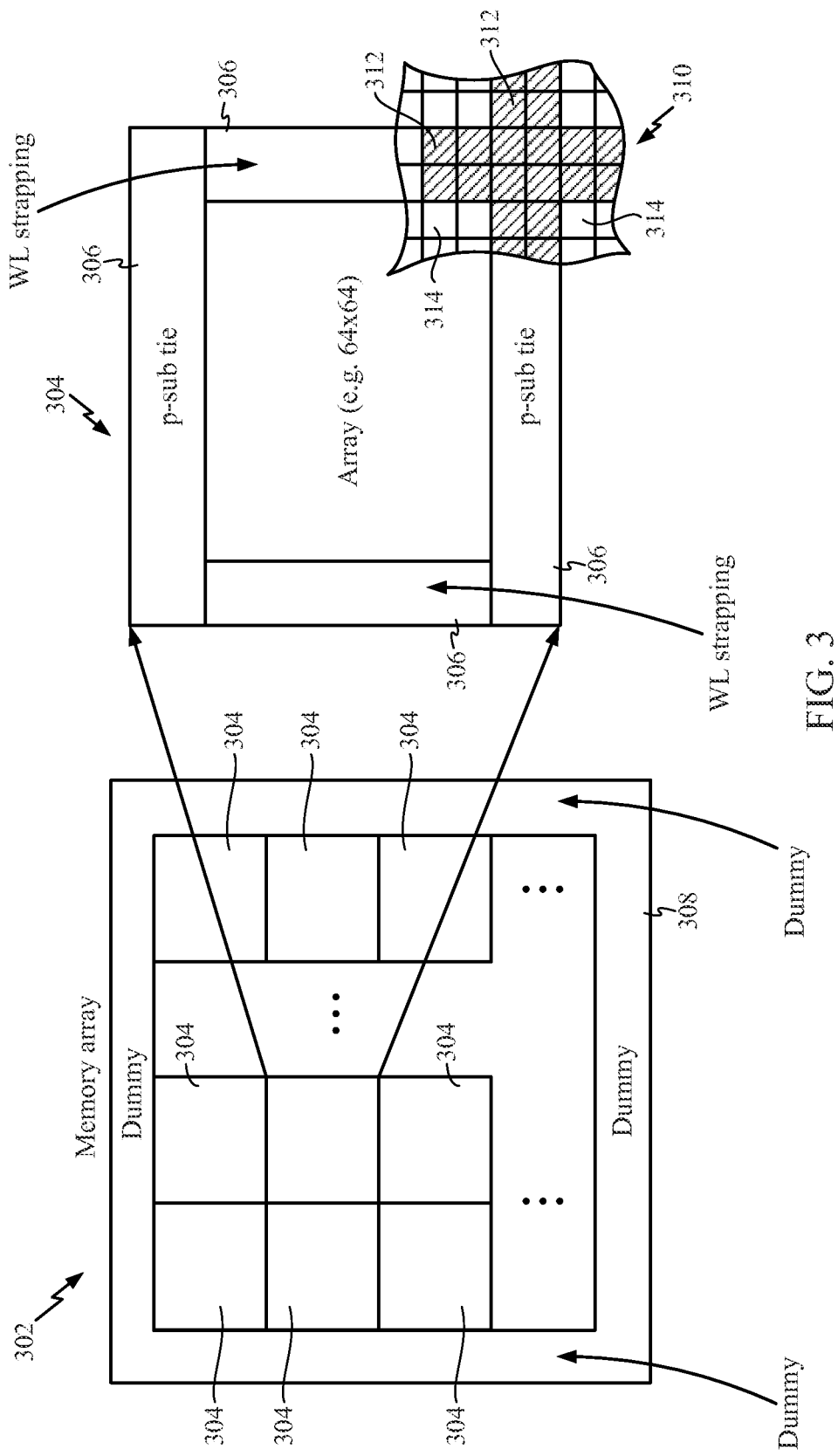
FIG. 3 is a block diagram showing a large scale MRAM memory according to an aspect of the present disclosure.

Aspects of the present disclosure relate to a large scale memory array including a uniform pattern of bit cells. A large scale memory array according to one aspect of the present disclosure is described with reference to FIG. 3. The large scale memory array 302 is divided into a number of sub-arrays 304 which each include a pattern of bit cells 310. In the example shown in FIG. 3, each sub-array includes 64×64 bit cells, for example.

To provide space for signal distribution circuitry such as word line strapping and substrate ties, a number of dummy bit cells 312 are placed around the perimeter of each sub-array 304. The dummy bit cells 312 can include non-functional bit cells, such as bit cells having MTJs which are not connected to memory control circuitry. Each of the sub-arrays 304 within the large scale memory array 302 are thereby separated by an area of dummy bit cells 312 in which each of the dummy bit cells 312 has the same dimensions as active bit cells 314 within the sub-arrays.

According to the present disclosure, signal distribution circuitry 306 such as word line strapping and substrate ties are formed with a width or height corresponding to the width or height of the dummy bit cells 312 so that the signal distribution circuitry occupies the same footprint as the area of the dummy bit cells 312. The dummy bit cells 312 have the same uniform size and pattern as the active bit cells 314 so the uniform pattern of bit cells across the large scale array 302 is not interrupted by placement of the signal distribution circuitry 306. Active memory cells 314 in the sub-arrays 304 on either or both sides of the signal distribution circuitry 306 may be coupled to the signal distribution circuitry 306. In an illustrative embodiment word line strapping is formed on a lower metal layer such as Metal-2 of a complementary metal oxide semiconductor (CMOS) die.

Aspects of the present disclosure adjust the size of the signal distribution circuitry footprint, including the footprint of substrate ties and word line strapping in an MRAM array to accommodate dummy MTJs with the same size as normal MTJs while not breaking the MTJ pattern uniformity. By increasing the width of word line strapping from a minimal design width to about equal to the width of a bitcell, or an integral multiple of bitcell widths, dummy cells with larger MTJs are not necessary. This decreases the overall array area as compared to earlier MRAM array designs. Similarly, the height of the substrate ties may be increased from a minimal design width to equal the height of a bitcell or an integral multiple of bitcell heights. This method keeps the MTJ pattern uniformity across a large memory array (e.g. a 0.25 Mb bank) and may reduce the area of a large scale memory array by about 3%.

According to an aspect of the present disclosure, edge dummy cells with large dummy MTJs may be placed around the periphery of the large scale memory array 308 where the MTJ pattern uniformity breaks. A large number of edge dummy cells may be placed to ensure the MTJ pattern uniformity at the edges without considerably increasing the overall array size.

According to the various aspects of the present disclosure, unit layouts for signal distribution lines or circuitry have dimensions that are integer multiples of active bit cells. This places dummy MTJs inside signal distribution circuitry without disrupting memory pattern uniformity across sub-arrays. These dummy memory elements have the same size as active memory elements.

According to aspects of the present disclosure, it is unnecessary to place dummy bitcells with large-size dummy memory elements around active bitcells in every sub-array to compensate for the macro-loading effect at the edges. These dummy bitcells are not required because pattern uniformity is maintained across a large memory array. The elimination of these large-size dummy bit cells from around the active bit cells in every sub-array according to the present disclosure can lead to smaller chip size. However, the dummy bitcells can be placed for other purposes such as for use as transistor dummies, for example. In this case, dummy memory elements in the dummy bitcells have the same dimension as the active memory elements Still, active memory elements at the edges of a large memory array will be affected by the macro-loading effect. Hence, dummy memory elements may still need to be placed at the edges of the large array. Multiple lines of dummy memory elements can be placed without increasing the chip size substantially. The size of these dummy memory elements can be equal to or larger than that of the active memory elements.

Figure 4:
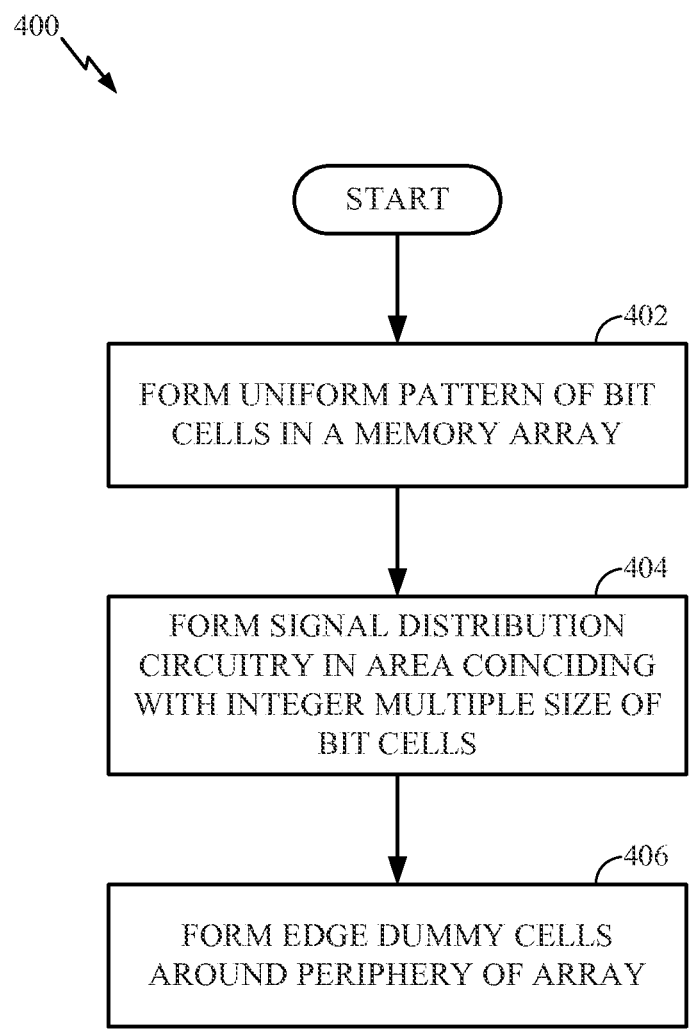
FIG. 4 is a flow chart illustrating a method of forming the exemplary MRAM according to one embodiment.

FIG. 4 is a flow chart illustrating a method 400 of forming a large scale memory according to an aspect of the present disclosure. The method 400 includes forming a pattern of adjacent uniformly sized bit cells in a memory array at block 402 and forming signal distribution circuitry in an area having a size coinciding with an integer multiple of a size of the uniformly sized bit cells at block 404. In an illustrative embodiment, the method 400 may also include forming a number of edge dummy cells extending around a perimeter of the memory array at block 406.

Figure 5:
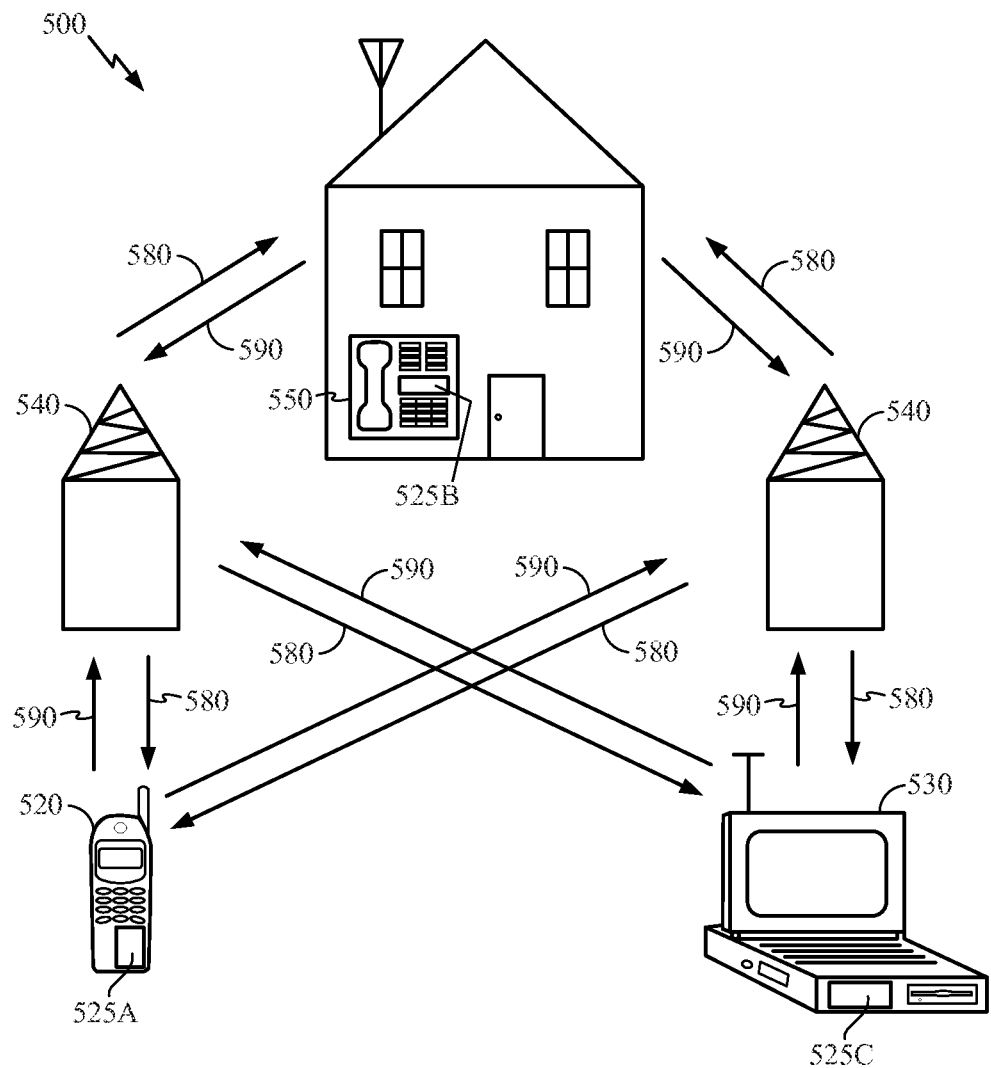
FIG. 5 is a block diagram showing an exemplary wireless communication system in which an embodiment of the disclosure may be advantageously employed.

FIG. 5 is a block diagram showing an exemplary wireless communication system 500 in which an embodiment of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C and 525B, that include the disclosed MRAM. It will be recognized that other devices may also include the disclosed MRAM, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any device which includes MRAM.

Figure 6:
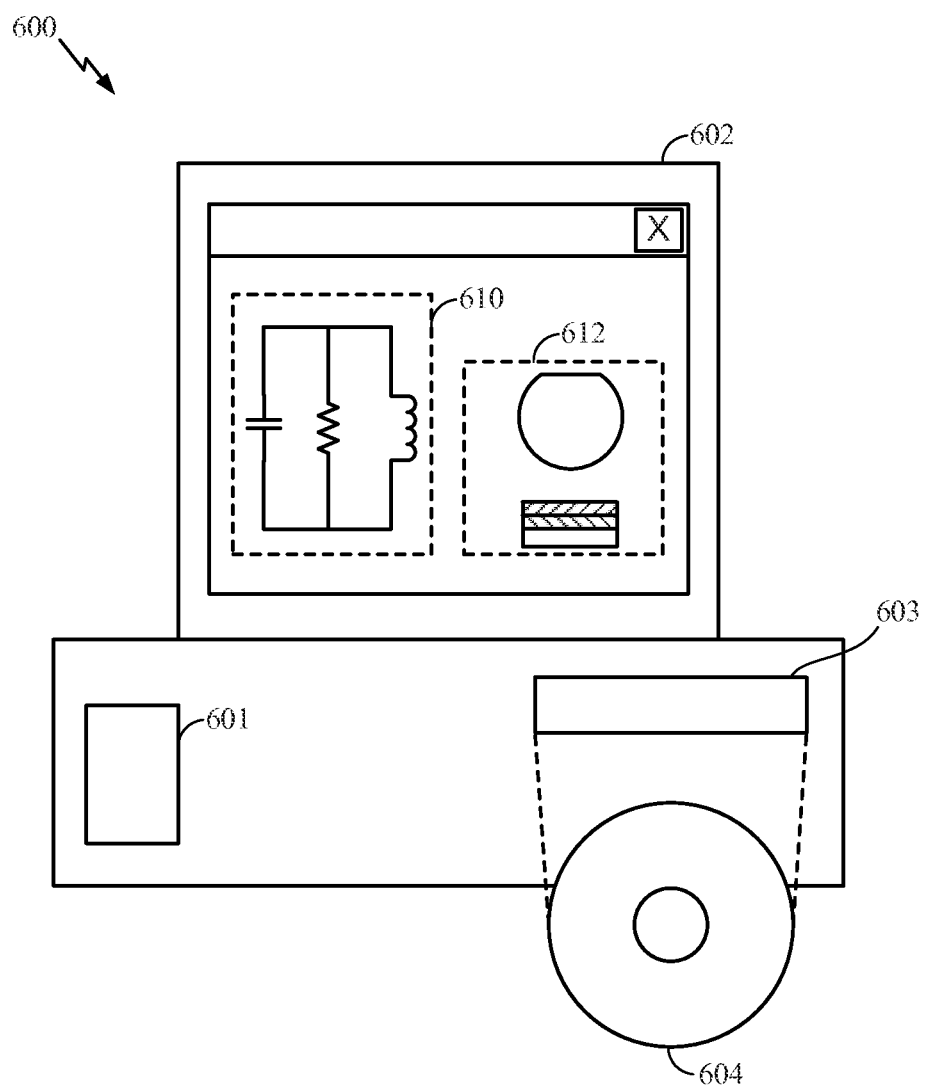
FIG. 6 is a block diagram illustrating a design workstation used for circuit, layout, and logic design of a semiconductor component according to one embodiment.

FIG. 6 is a block diagram illustrating a design workstation used for circuit, layout, and logic design of a semiconductor component, such as a MRAM as disclosed above. A design workstation 600 includes a hard disk 601 containing operating system software, support files, and design software such as Cadence or OrCAD. The design workstation 600 also includes a display to facilitate design of a circuit 610 or a semiconductor component 612 such as a packaged integrated circuit having MRAM. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and bin-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory array, comprising:
    a pattern of adjacent uniformly sized bit cells; and
    signal distribution circuitry occupying an area having a size coinciding with an integer multiple of a size of the uniformly sized bit cells.

2. The memory array of claim 1, in which the adjacent uniformly sized bit cells comprise a plurality of active bit cells outside of a footprint of the signal distribution circuitry area.

3. The memory array of claim 2, comprising:
    a resistive memory element configured in each of the active bit cells.

4. The memory array of claim 2, comprising:
    a magnetic tunnel junction configured in each of the active bit cells.

5. The memory array of claim 2, in which the adjacent uniformly sized bit cells comprise a plurality of dummy bit cells within the footprint of the signal distribution circuitry area.

6. The memory array of claim 2, in which the signal distribution circuitry is coupled to the active bit cells.

7. The memory array of claim 1, in which the signal distribution circuitry comprises:
    word line strapping extending in a first dimension of the pattern.

8. The memory array of claim 1, in which the signal distribution circuitry comprises:
    at least one substrate tie extending in a second dimension of the pattern.

9. The memory array of claim 1, further comprising a plurality of edge dummy cells extending around a perimeter of the memory array.

10. The memory array of claim 9 in which the edge dummy cells comprise a plurality of the uniformly sized bit cells.

11. The memory array of claim 9 in which the edge dummy cells comprise bit cells larger than the uniformly sized bit cells.

12. The memory array of claim 1, integrated into a magnetic random access memory (MRAM).

13. The memory array of claim 1, integrated into at least one of a mobile phone, a set top box, a music player, a video player, an entertainment unit, a navigation device, a computer, a hand-held personal communication systems (PCS) unit, a portable data unit, and a fixed location data unit.

14. A method, comprising:
    forming a pattern of adjacent uniformly sized bit cells in a memory array; and
    forming signal distribution circuitry in an area having a size coinciding with an integer multiple of a size of the uniformly sized bit cells.

15. The method of claim 14, further comprising:
    forming a plurality of edge dummy cells extending around a perimeter of the memory array.

16. The method of claim 15 comprising:
    forming the edge dummy cells as a plurality of the uniformly sized bit cells.

17. The method of claim 15 comprising:
    forming the edge dummy cells as bit cells larger than the uniformly sized bit cells.

18. The method of claim 14, comprising:
    integrating the memory array into a magnetic random access memory (MRAM).

19. The method of claim 14, comprising:

integrating the memory array into at least one of a mobile phone, a set top box, a music player, a video player, an entertainment unit, a navigation device, a computer, a hand-held personal communication systems (PCS) unit, a portable data unit, and a fixed location data unit.

20. A method, comprising the steps of:

forming a pattern of adjacent uniformly sized bit cells in a memory array; and forming signal distribution circuitry in an area having a size coinciding with an integer multiple of a size of the uniformly sized bit cells.

21. The method of claim 20, further comprising the step of:

integrating the memory array into at least one of a mobile phone, a set top box, a music player, a video player, an entertainment unit, a navigation device, a computer, a hand-held personal communication systems (PCS) unit, a portable data unit, and a fixed location data unit.

22. An apparatus, comprising:

means for storing data, the data storing means being uniformly sized and arranged within a memory array; and means for distributing signals, the signal distributing means occupying an area having a size coinciding with an integer multiple of a size of the uniformly sized data storing means.

23. The apparatus of claim 22, integrated into at least one of a mobile phone, a set top box, a music player, a video player, an entertainment unit, a navigation device, a computer, a hand-held personal communication systems (PCS) unit, a portable data unit, and a fixed location data unit.

\* \* \* \* \*